United States Patent
Watabe

(10) Patent No.: US 7,729,418 B2
(45) Date of Patent: Jun. 1, 2010

(54) TESTING CIRCUIT FOR MEASURING A FREQUENCY OF SIGNAL OUTPUT FROM CLOCK GENERATOR

(75) Inventor: Yuji Watabe, Osaka-fu (JP)

(73) Assignee: Ricoh Company, Ltd., Tokyo (JP)

( * ) Notice: Subject to any disclaimer, the term of this patent is extended or adjusted under 35 U.S.C. 154(b) by 933 days.

(21) Appl. No.: 11/440,088

(22) Filed: May 25, 2006

(65) Prior Publication Data

US 2006/0268971 A1 Nov. 30, 2006

(30) Foreign Application Priority Data

May 26, 2005 (JP) ............... 2005-154310

(51) Int. Cl.
*H04B 3/46* (2006.01)
(52) U.S. Cl. .............. 375/226; 375/145; 375/213; 375/215; 375/294; 375/377
(58) Field of Classification Search ........... 375/145, 375/213, 215, 294, 377
See application file for complete search history.

(56) References Cited

U.S. PATENT DOCUMENTS 4,143,362 A * 3/1979 Ulmer .................. 341/118
5,668,480 A * 9/1997 Nintzel ................. 324/709
6,150,963 A * 11/2000 Boscolo et al. ............ 341/53

FOREIGN PATENT DOCUMENTS

JP 63-187949 A 8/1988

* cited by examiner

*Primary Examiner*—Shuwang Liu
*Assistant Examiner*—Kabir A Timory
(74) *Attorney, Agent, or Firm*—Dickstein Shapiro LLP

(57) ABSTRACT

A testing circuit measures a center frequency of a clock signal outputted by a clock generator. The clock generator has a frequency modulator capable of (1) performing a frequency sampling accurately for the duration of modulation frequency and reducing the duration for frequency measurements, and (2) implementing proper testing of the down-spread controlling feature as one of the SSCG modulation functions by accurately determining the center frequency of the clock signal. The testing circuit measures a center frequency of a clock signal outputted by a clock generator by converting an analog modulation signal into a digital signal and outputting the digital signal, counting the period of the clock signal to obtain a count according to the digital signal outputted by the clock generator, and comparing the count with the predetermined specification values related to the center frequency of the clock signal to obtain and output a comparison result.

7 Claims, 8 Drawing Sheets

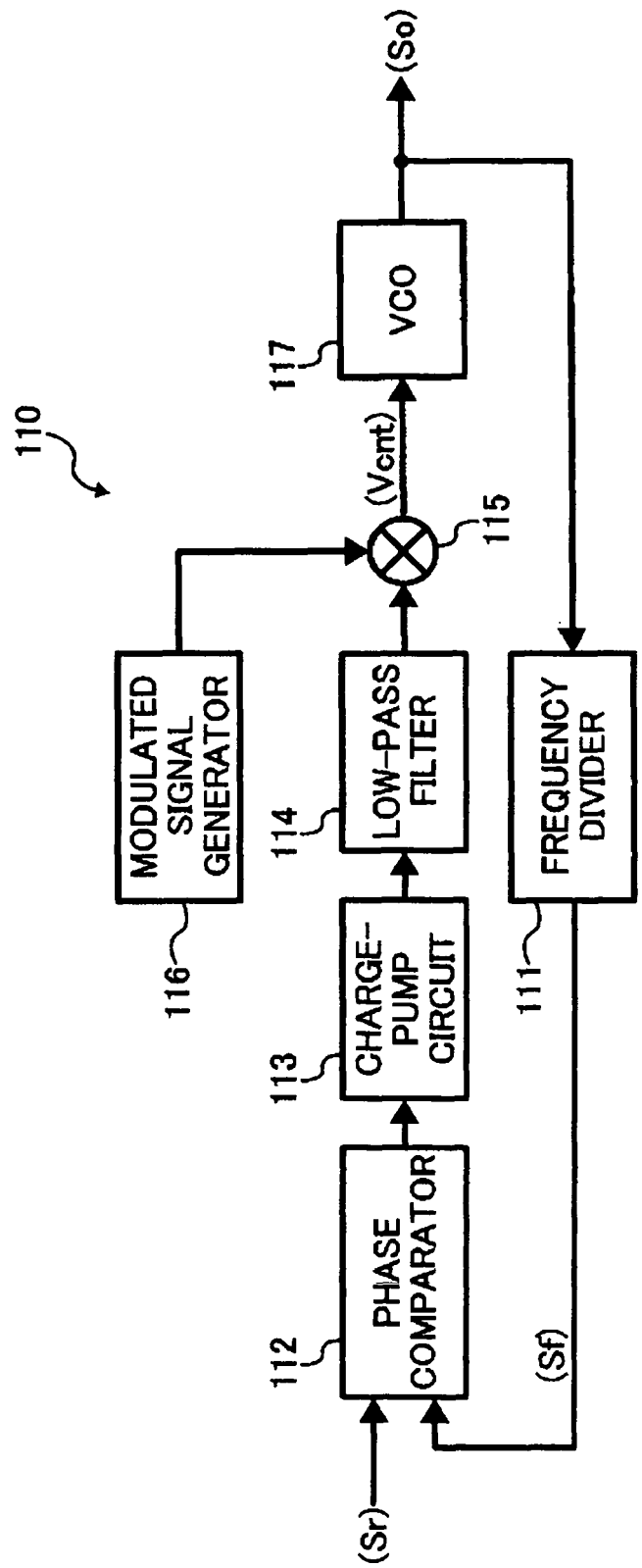

TESTING CIRCUIT FOR MEASURING A FREQUENCY OF SIGNAL OUTPUT FROM CLOCK GENERATOR

This application claims priority to Japanese Patent Application No. 2005-154310, filed with the Japanese Patent Office on May 26, 2005, the entire contents of which are hereby incorporated by reference.

FIELD OF INVENTION

The invention generally relates to testing circuits, and more specifically to a testing circuit capable of accurately measuring a center frequency of SSCG modulation signal in relative short duration of time even when a scattering arises in the modulation period of the signals outputted from an SSCG clock generator.

BACKGROUND OF INVENTION

A testing circuit is known for measuring the frequency of signal output from a clock generator as illustrated in the diagrammatic block diagram of FIG. 7.

Referring to FIG. 7, the testing circuit 100 for the frequency measurement includes a clock generator 101 configured to generate and output a clock having a predetermined frequency, and a frequency counter 102 configured to count a frequency of the clock outputted by the clock generator 101 to obtain frequency data and output resulting data to a counter memory 103.

The counter memory 103 subsequently sends the frequency data to a comparator circuit 104 and a specification memory 105 is configured to output the data on the upper and lower limits to the comparator circuit 104.

The comparator circuit 104 is configured to determine whether the frequency data sent from the counter memory 103 falls within the upper and lower limits and output a decision signal representative of the result obtained from the determination.

Therefore, the frequency testing can be properly implemented with the abovementioned configuration of the output frequency testing circuit 100.

In addition, another clock generator is disclosed in Japanese Laid-Open Patent Application No. 63-187949, for example. This clock generator is capable of automatically testing a variety of frequencies by counting by a frequency counter a frequency of the signal modulated by a frequency modulation circuit.

On the other hand, SSCG (spread spectrum clock generation) technique has been developed recently for suppressing EMI (electromagnetic interference) noises which are radiated from various electronic instruments.

The SSCG technique is configured to apply the frequency modulation to clock signals and disperse the frequency range of EMI noise emission, whereby the level of radiated EMI can be reduced.

In respect to the modulation, several waveforms are utilized such as, for example, either triangular or sinusoidal wave having a constant period, and a triangular waveform synthesized from a plurality of waves each having different modulation periods.

The output frequency of SSCG is generally in the range from several MHz to several hundreds Hz, while a modulation frequency in use for modulating the SSCG output ranges approximately 30 kHZ which is considerably smaller than the SSCG frequency.

FIG. 8 is a diagrammatic block diagram illustrating the configuration of an SSCG circuit previously known.

Referring to FIG. 8, a frequency divider 111 included in the SSCG circuit 110 is configured to implement multiplication setting on the clock signal So outputted by the SSCG circuit 110 such that a phase comparison is made by a phase comparator 112 between a reference input signal Sr and a feedback signal Sf formed by dividing by the frequency divider 111, and that a pulse signal corresponding to the phase difference resulted from the comparison is generated and then outputted by a charge-pump circuit 113.

An output signal from the charge-pump circuit 113 is subjected to the process of removing noises by a low-pass filter 114 and of smoothing, and subsequently outputted to an adder 115.

On the other hand, a modulated signal generator 116 is configured to generate a predetermined modulated signal for the SSCG circuit 110, and output a resulting signal to adder 115.

The adder 115 is configured to add two signals, one outputted by a low-pass filter 114 and the other outputted by a modulated signal generator 116, and then output to VCO (voltage control oscillator) 117 as a control voltage Vcnt.

The VCO 117 is configured to generate and output a clock signal So, which is modulated according to the control voltage Vcnt outputted by the adder 115.

FIGS. 9A through 9C illustrate modulation waveforms of clock signals So outputted by the SSCG circuit 110 such as a triangular wave, a sinusoidal wave, and another triangular wave synthesized from plural waves each having different modulation frequencies.

FIG. 10 illustrates another modulation waveform of clock signal So outputted by the SSCG circuit 110.

As illustrated in FIG. 10, the waveform of the clock signal So outputted by the SSCG circuit 110 is assumed to be triangular, having a center frequency fo and a frequency spread $\pm \Delta f$.

When the frequency measurement on this signal is carried out for duration, t1~t2, the increase in the integral of the waveform for one half of the duration ranging from t1 to ta is obtained to be equal to the decrease for the other half of the duration ranging from ta to t2. Therefore, the center frequency of the clock signal So is obtained to be fo.

However, another case may be considered in which the value of the center frequency is influenced by several factors.

For example, assuming the case in which (1) a scattering arises in modulation frequency caused by fluctuation during forming process, (2) the waveform of the clock signal So outputted by the SSCG circuit 110 is triangular, having a center frequency fo, and (3) the period of the modulation is larger than that of FIG. 10.

When a frequency count of the clock signal So is then carried out for the duration, t1~t2, as shown in FIG. 11, the amount of increase in the integral of the waveform is obtained to be smaller than that of decrease. As a result of the smaller amount in integral, the center frequency is obtained as f1 which is smaller than fo.

That is, a difficulty in the previous method is encountered in that a center frequency is measured by being shifted from the actual frequency.

Therefore, in measuring the center frequency of the modulated clock signal outputted by the SSCG circuit by a previous counter and method, the difficulty such as above has been encountered in that its center frequency may be obtained as one shifted from the actual frequency depending on measurement timing.

In addition, if the frequency of modulated signal outputted by the SSCG circuit is scattered from one sample to another, the frequency count of the clock signal may be obtained to be different even among plural samples having the same center frequency even when the measurements are carried out for the same duration.

In the case of a triangular wave generator used as the means for generating modulated signals, in particular, a considerable scattering in modulation frequency may arise from one testing sample to another due to fluctuation during the process for forming the capacitance incorporated on the output side of the generator.

Moreover, although the accuracy of frequency measurement may increase in general with increasing the duration for the measurements, which may not be advantageous in the present frequency measurements, since the modulation frequency is considerably smaller than the SSCG output frequency and the increased duration has to lead to a considerably prolonged measurement period, whereby the increase is incurred in the number of counter bits as well as process costs.

It is therefore desirable to provide a testing circuit having improved capability of accurately measuring a center frequency of the signals outputted by a clock generator.

SUMMARY OF THE INVENTION

Accordingly, it is an object of the invention to provide a testing circuit having most, if not all, of the advantages and features of similarly employed circuits, while reducing or eliminating many of the aforementioned disadvantages.

It is another object to provide a testing circuit configured to measure a center frequency of a clock signal outputted by a clock generator. The clock generator has frequency modulation capability of (1) performing a frequency sampling accurately for the period of modulation frequency and reducing the duration of frequency measurements, which are carried out with an SSCG modulation clock generator by generating a digital signal having a modulation frequency to be used as an enabling signal for determining the duration of SSCG output frequency measurement, and (2) implementing proper testing of the down-spread controlling feature as one of the SSCG modulation functions by accurately determining center frequencies.

The following description is a synopsis of only selected features and attributes of the present disclosure. A more complete description thereof is found below in the section entitled "Description of the Preferred Embodiments."

The above and other objects of the invention are achieved by providing a testing circuit configured to measure a center frequency of a clock signal outputted by a clock generator which has frequency modulation capability of generating the clock signal by adding a predetermined modulated analog signal to a control voltage to be outputted to a voltage control oscillator.

The testing circuit comprises an A/D converter configured to convert an analog signal into a digital signal and output the digital signal, counter configured to count a period of the clock signal to obtain a count according to the digital signal, a counter memory configured to store the count, a specification memory configured to store specification values related to the center frequency of the clock signal, and a comparator configured to compare the count with the specification values to obtain a comparison result and then output the comparison result.

In addition, the A/D converter comprises a comparator configured to binarize the predetermined modulated analog signal using one half of voltage amplitude thereof as a base, and the counter is configured to count the period of the clock signal outputted by the clock generator according to a binary signal outputted by the comparator.

In another embodiment, a testing circuit is provided to measure a center frequency of a clock signal outputted by a clock generator which has frequency modulation capability of generating the clock signal by adding a triangular wave signal generated by integrating a square wave signal to a control voltage to be outputted to a voltage control oscillator.

This testing circuit comprises a counter configured to count a period of the clock signal to obtain a count according to the square wave signal, a counter memory configured to store the count, a specification memory configured to store specification values related to the center frequency of the clock signal, and a comparator configured to compare the count with the specification values to obtain a comparison result and output the comparison result.

These and other features and advantages of the invention will be more clearly seen from the following detailed description of the invention which is provided in connection with the accompanying drawings.

BRIEF DESCRIPTION OF THE DRAWINGS

In the following drawings, like reference numerals will be used to refer to like elements, in which:

FIG. 8 is a diagrammatic block diagram illustrating the configuration of an SSCG circuit previously known;

DETAILED DESCRIPTION OF PREFERRED EMBODIMENTS

Figure 1:
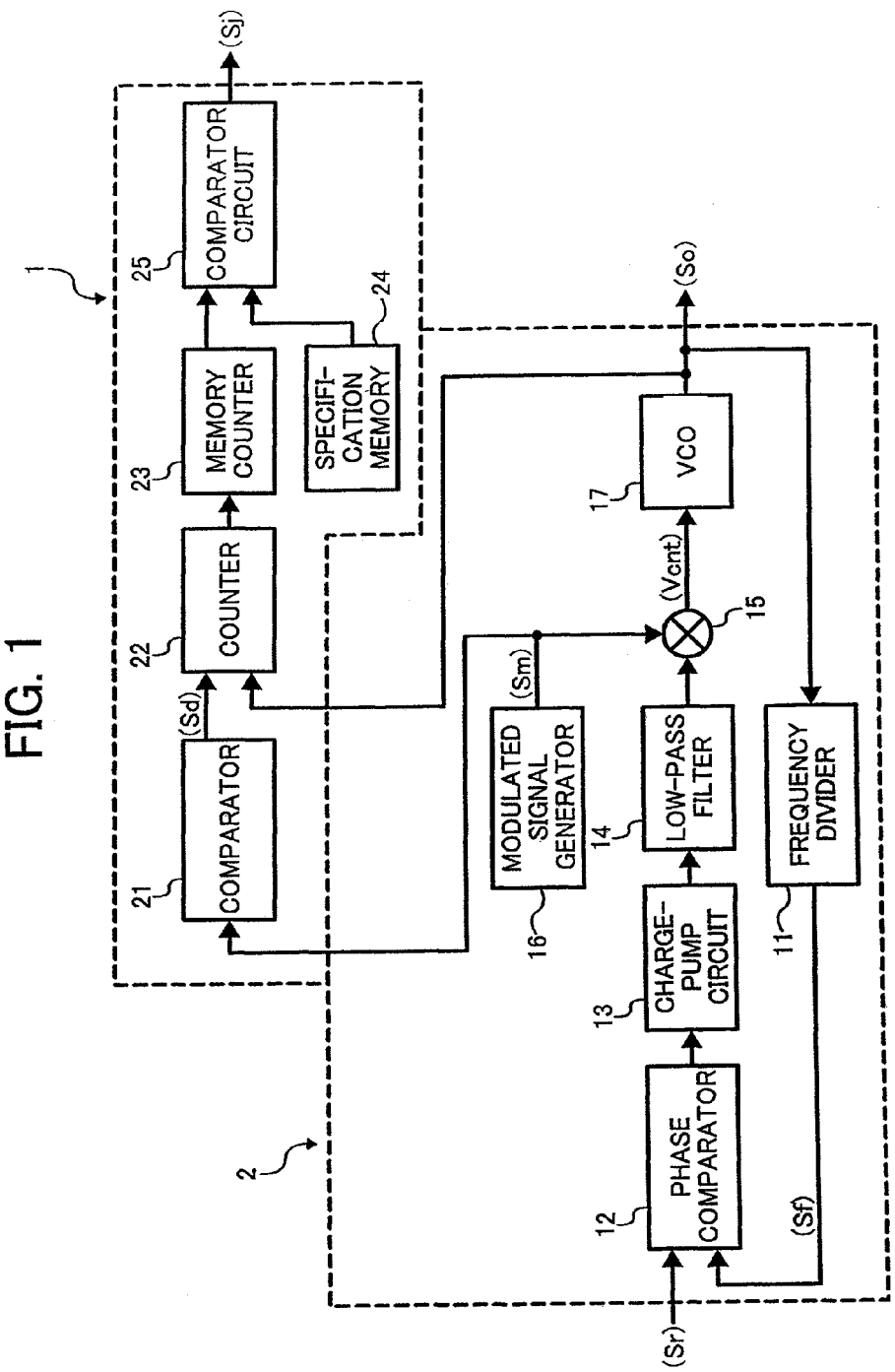
FIG. 1 is a diagrammatic block diagram illustrating the configuration of a testing circuit for a clock generator according to an exemplary embodiment of the invention.

In the detailed description which follows, specific embodiments are described on a testing circuit which is configured to measure a center frequency of a clock signal outputted by a clock generator.

It is understood, however, that the present disclosure is not limited to these embodiments. For example, it is appreciated that the present testing circuit may also be adaptable to a variety of other measurements. Other embodiments will be apparent to those skilled in the art upon reading the following description.

In addition, in the description that follows specific terminology is used in many instances for the sake of clarity. However, the disclosure of this patent specification is not intended to be limited to the specific terminology so selected and it is to be understood that each specific element includes all technical equivalents that operate in a similar manner.

According to a general example in the present disclosure, there provided is a testing circuit configured to measure a center frequency of a clock signal outputted by a clock generator which has frequency modulation capability of generating the clock signal by adding a predetermined modulated analog signal to a control voltage to be outputted to a voltage control oscillator.

The testing circuit includes at least an A/D converter, a counter, a counter memory, a specification memory, and a comparator.

The A/D converter is configured to convert an analog signal into a digital signal and output the digital signal, the counter is configured to count a period of the clock signal to obtain a count according to the digital signal, the counter memory to store the count, the specification memory to store specification values related to the center frequency of the clock signal, and the comparator to compare the count with the specification values to obtain a comparison result and output the comparison result, respectively.

Specifically, the A/D converter is formed by comprising a comparator configured to binarize the predetermined modulated analog signal using one half of voltage amplitude thereof as a base.

In addition, the counter is configured to count the period of the clock signal outputted by the clock generator according to a binary signal outputted by the comparator.

Still in addition, the counter is configured to count the period of the clock signal for duration of either one cycle, or a multiple, of a clock pulse inputted by the A/D converter.

Moreover, the clock generator is configured to multiply the clock signal.

In another aspect, a testing circuit is provided to measure a center frequency of a clock signal outputted by a clock generator which has frequency modulation capability of generating the clock signal by adding a triangular wave signal generated by integrating a square wave signal to a control voltage to be outputted to a voltage control oscillator.

The testing circuit includes at least a counter configured to count a period of the clock signal to obtain a count according to the square wave signal, a counter memory configured to store the count, a specification memory configured to store specification values related to the center frequency of the clock signal, and a comparator configured to compare the count with the specification values to obtain a comparison result and output the comparison result.

In addition, the counter is configured to count the period of the clock signal for duration of either one cycle, or a multiple, of a clock pulse inputted by the A/D converter.

Having described the present disclosure in general, several preferred embodiments of the testing circuit will be described herein below according to the present invention with reference to FIGS. 1 through 6.

FIG. 1 is a diagrammatic block diagram illustrating the configuration of a testing circuit for a clock generator according to an exemplary embodiment of the invention.

Referring to FIG. 1, the testing circuit 1 is configured to perform a test on a center frequency of clock signal So outputted by a clock generator 2 serving as SSCG (Spread Spectrum Clock Generator).

First, a frequency divider 11 in the clock generator 2 is configured to implement multiplication setting on the clock signal So such that a phase comparison is made by a phase comparator 12 between a reference input signal Sr input from outside and a feedback signal Sf formed by dividing by the frequency divider 11, and that a pulse signal corresponding to the phase difference resulted from the comparison is generated and outputted by a charge-pump circuit 13.

An output signal from the charge-pump circuit 13 is subjected to the process of removing noises by a low-pass filter 14 and of smoothing, and subsequently outputted to an adder 15.

On the other hand, a modulated signal generator 16 is configured to generate a predetermined modulated signal for SSCG, and output a resulting signal to adder 15.

The adder 15 is configured to add two signals, one outputted by the low-pass filter 14 and the other outputted by a modulated signal generator 16, and output to VCO (voltage control oscillator) 17 as a control voltage Vcnt.

The VCO 17 is configured to generate and then output a clock signal So, which is modulated according to the control voltage Vcnt outputted by the adder 15.

In the next place, a comparator 21 included in the testing circuit 1 is configured to be input with a modulated signal Sm outputted by the modulated signal generator 16, binarize the thus input modulated signal Sm using one half of the amplitude level of modulated signal Sm as the base for the binarization, and output a digital signal Sd resulted from the binarization to a counter 22.

Incidentally, the comparator 21 constitutes an A/D converter.

The counter 22 is configured to obtain count data of the clock signal So using the digital signal Sd, which is outputted by the comparator 21, as an enabling signal for counting the clock signal So and output the resulting cycle data to a counter memory 23.

The counter memory 23 is configured to store the cycle data obtained by the counter 22 and output the thus stored cycle data to a comparator circuit 25.

A specification memory 24, in which upper and lower limits of allowable frequency range of SSCG are respectively stored in advance, is configured to output the upper and lower limits to the comparator circuit 25.

The comparator circuit 25 is configured to determine whether the cycle data sent from the counter memory 23 falls within the upper and lower limits and output a decision signal Sj representative of the result obtained from the determination.

Figure 2:
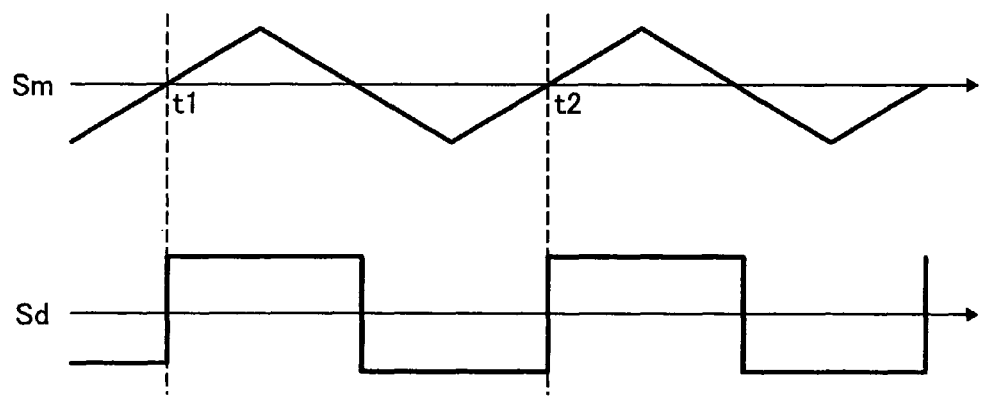
FIG. 2 illustrates several waveforms as the function of time of the input modulated signal outputted by a modulated signal generator and the digital signal outputted by the comparator 21, respectively.

FIG. 2 illustrates several waveforms as the function of time of the input modulated signal Sm outputted by the modulated signal generator 16 and the digital signal Sd outputted by the comparator 21, respectively.

Referring to FIG. 2, the cycle of the digital signal Sd outputted by the comparator 21 changes with the cycle of the input modulated signal Sm outputted by the modulated signal generator 16, which is caused by process fluctuation and other similar effects.

By utilizing the digital signal Sd as an enabling signal for determining the time duration for measuring SSCG output frequency, and by setting one cycle, for example, of the enabling signal to be equal to the period for measuring the cycle data for the clock signal So, the area of the portion on the positive side of the periodic variation of the clock signal So coincides with that on the negative side as illustrated in FIG. 2.

As a result, the center frequency of clock signal So can be computed accurately from both the clock number of the clock signal So obtained by the counter 22 and the period of the measurement.

In another aspect of the invention, frequency measurements may be carried out in a similar manner with the exception that a triangular wave generator is included in place of the abovementioned modulated signal generator 16 and that the comparator 21 of FIG. 1 can be eliminated, which will be described herein below.

Figure 3:
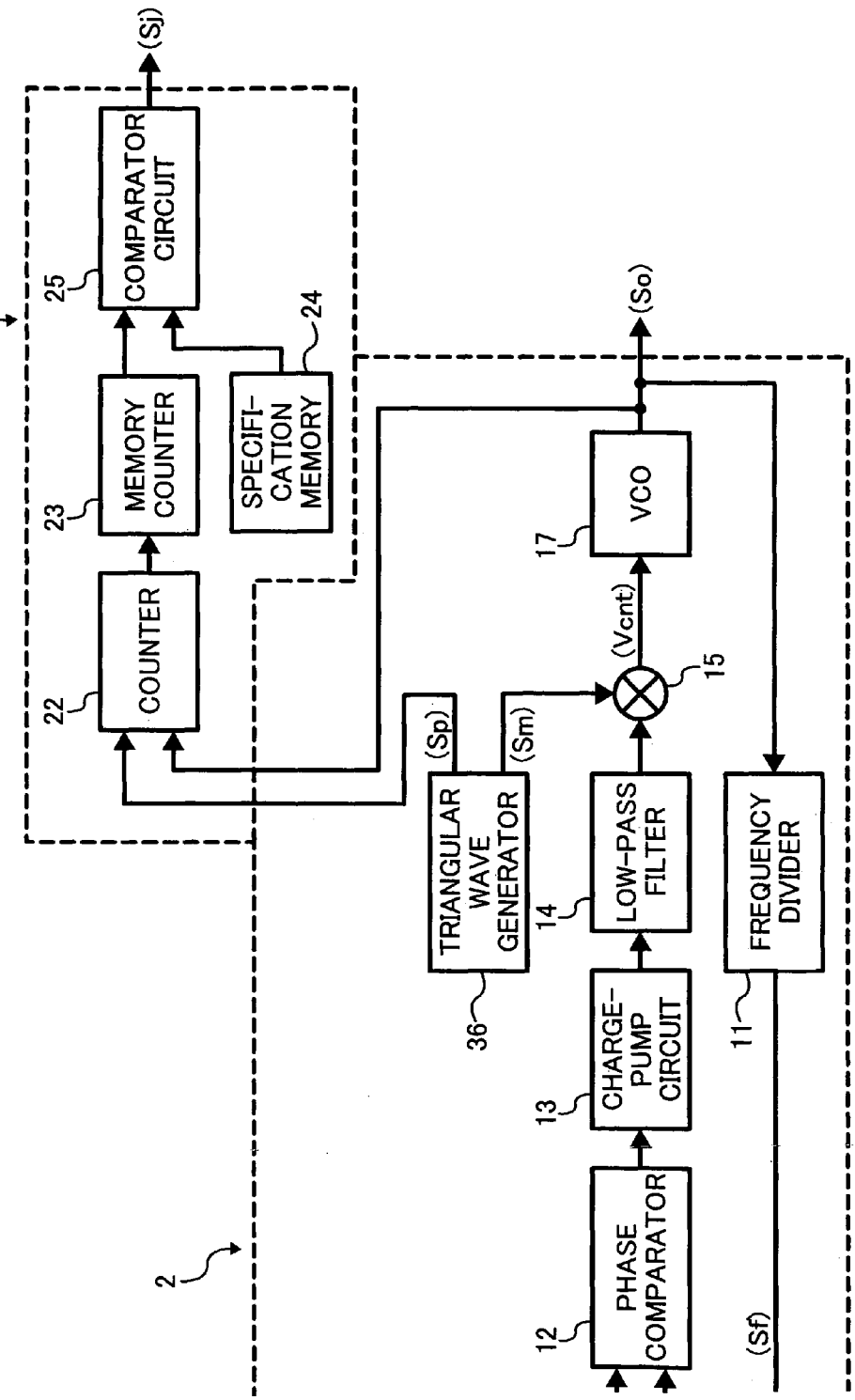
FIG. 3 is a diagrammatic block diagram illustrating the configuration of a testing circuit incorporating a triangular wave generator.
Figure 4:
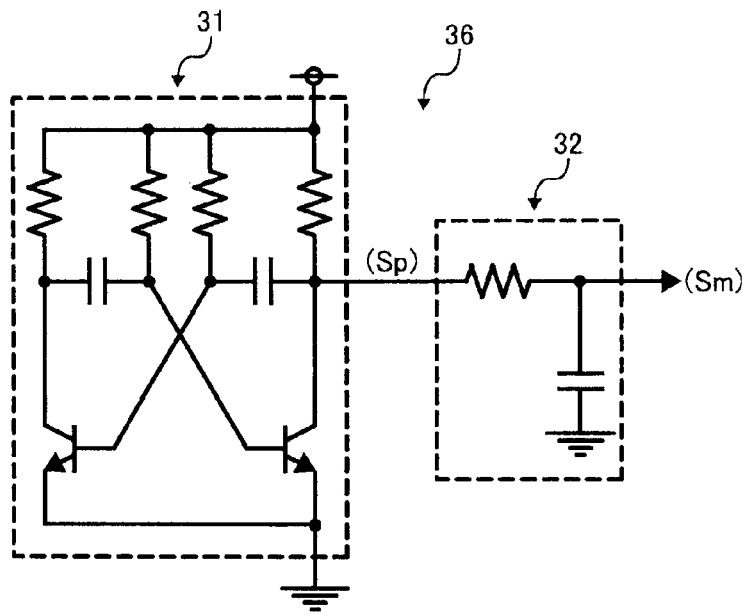
FIG. 4 is a circuit diagram illustrating the triangular wave generator included in the testing circuit.

FIG. 3 is a diagrammatic block diagram illustrating the configuration of a testing circuit incorporating a triangular wave generator 36 substituting for the modulated signal generator 16 of FIG. 1, and FIG. 4 is a circuit diagram illustrating the triangular wave generator 36.

The device components included in FIG. 3 that are similar to those in FIG. 1 are shown with identical numerical representations, and the description thereof is herein abbreviated for purposes of clarity.

Referring to FIG. 4, the triangular wave generator 36 includes a square wave generator 31 configured to generate and output a predetermined square wave signal Sp by means of a flip-flop, and an integrating circuit 32 configured to generate a triangular wave signal Sm by integrating the square wave signal Sp outputted by the square wave generator 31.

Referring now to FIG. 3, the triangular wave generator 36 is configured to output the triangular wave signal Sm to the adder 15 and the square wave signal Sp to the counter 22.

It should be noted that the square wave signal Sp corresponds to the aforementioned digital signal Sd outputted by the comparator 21 of FIG. 1.

As described herein above, by utilizing the square wave signal Sp generated in the triangular wave generator 36 as an enabling signal for determining the period for measuring SSCG output frequency, the area of the portion on the positive side of the periodic variation of the clock signal So coincides with that on the negative side. As a result, the center frequency of clock signal So can be obtained accurately from the clock number of the clock signal So and the period of the measurement.

In the triangular wave generator 36 of FIG. 4, there may arise a difficulty, in that a considerable scattering in modulation frequency is present from one testing sample to another due to fluctuation during the process for forming the capacitance incorporated into the output side of the generator 36.

In testing circuit 1 of FIG. 1, however, the measurement period changes according to the period of the triangular wave signal Sm. As a result, it is still feasible for the center frequency of clock signal So to be determined, even after the fluctuation of the triangular wave signal Sm, by identifying the point where the area on the positive side of the periodic variation of the clock signal So coincides with that on the negative side.

Figure 5:
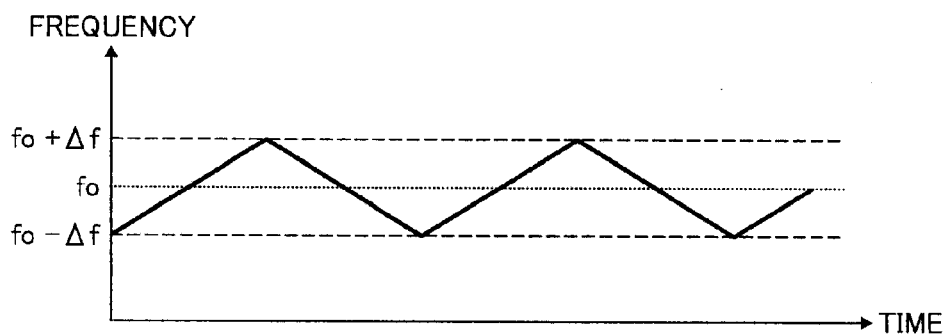
FIG. 5 illustrates the waveform as a function of time for the center-spread modulation of the clock signal.
Figure 6:
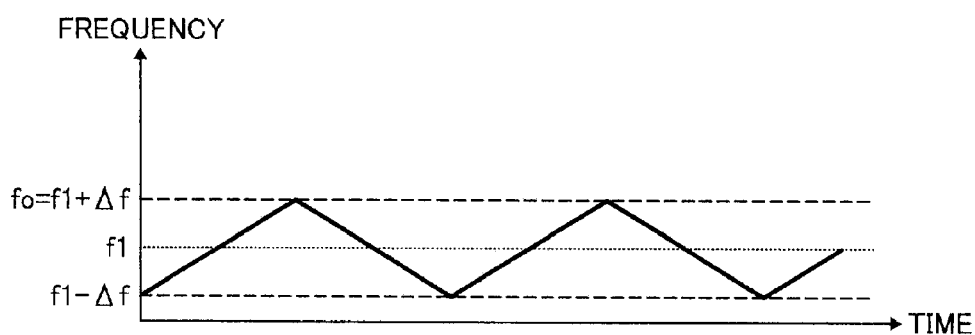
FIG. 6 illustrates the waveform as a function of time for the down-spread.
Figure 7:
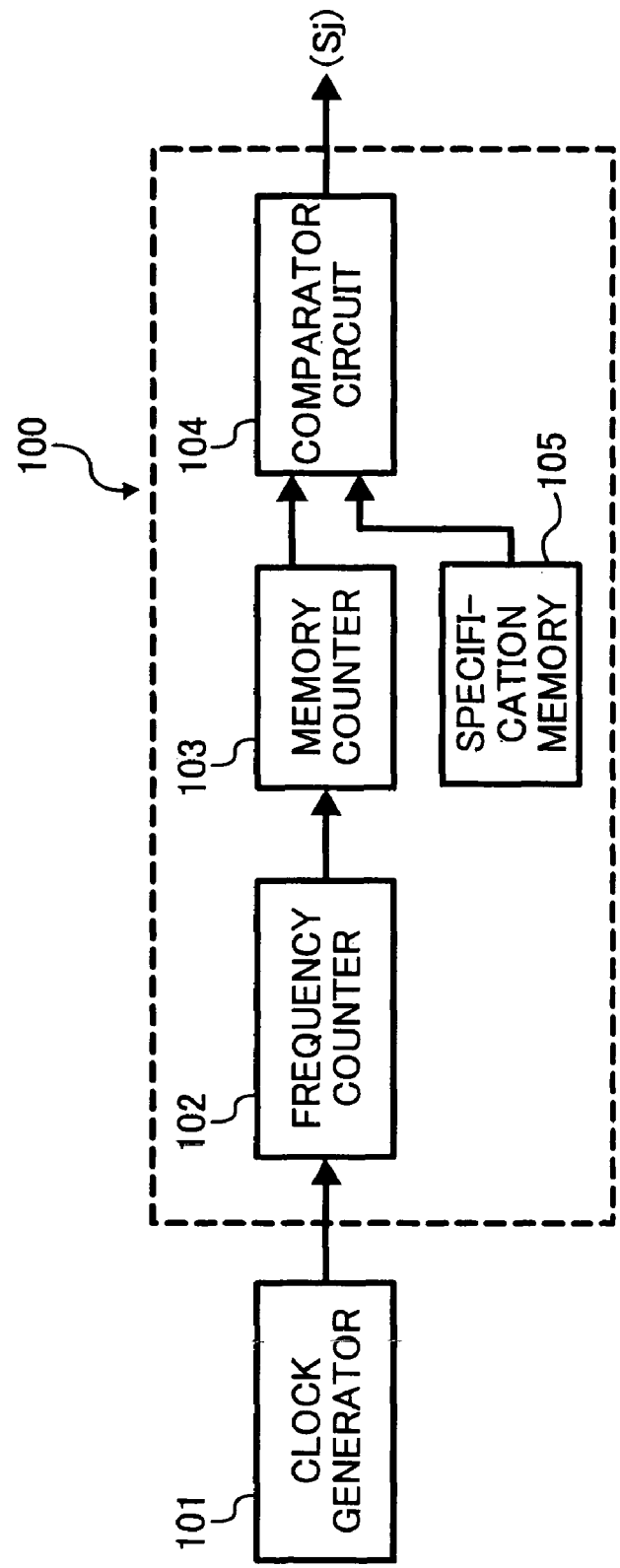
FIG. 7 is a diagrammatic block diagram illustrating the configuration of an output frequency testing circuit for a clock generator previously known.
Figure 9A:
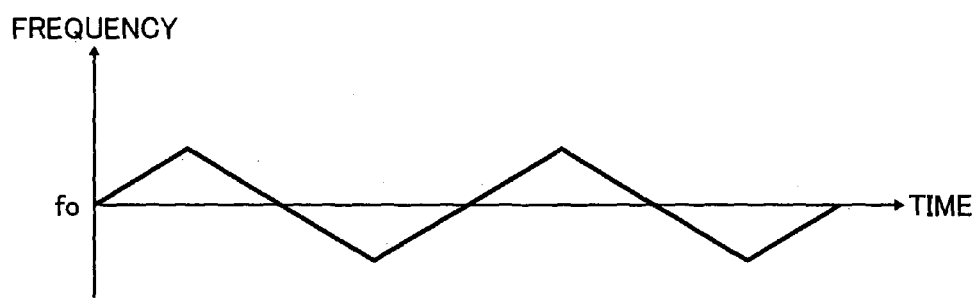
FIGS. 9A through 9C illustrate modulation waveforms of clock signals outputted by SSCG circuit, such as a triangular wave, a sinusoidal wave, and another triangular wave synthesized from a plurality of waves each having different modulation frequencies, respectively.
Figure 9B:
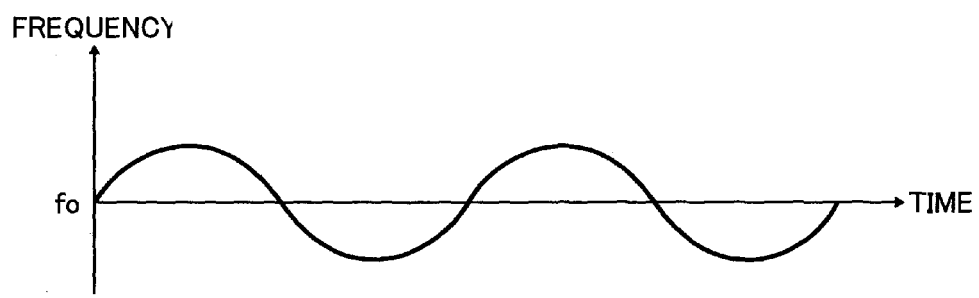
Figure 9C:
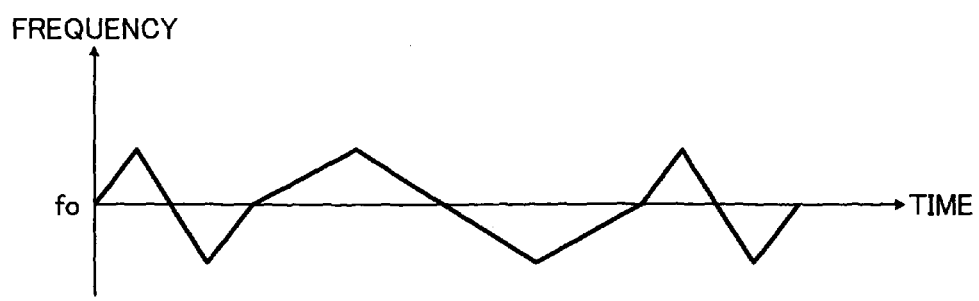
Figure 10:
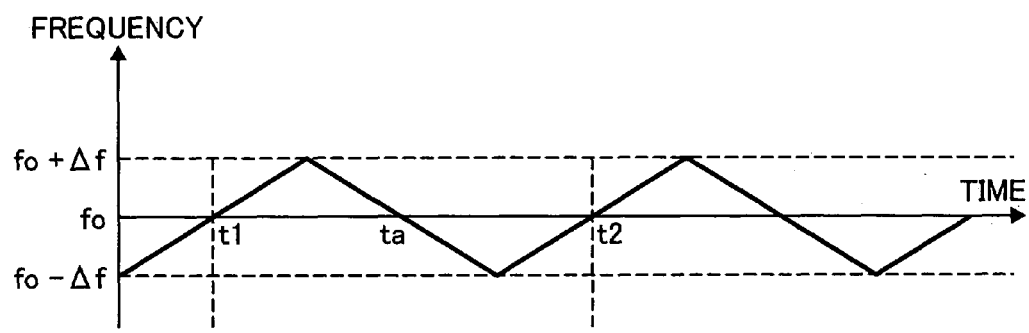
FIG. 10 illustrates another modulation waveform of clock signal outputted by a known SSCG circuit.
Figure 11:
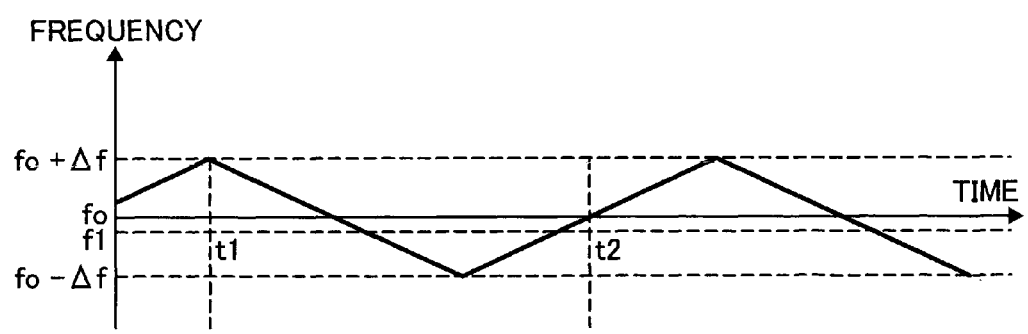
FIG. 11 illustrates still another modulation waveform of clock signal outputted by the known SSCG circuit.

FIG. 5 illustrates the waveform as a function of time for the center-spread modulation of the clock signal So, and FIG. 6 illustrates the waveform as a function of time for the down-spread.

Referring to FIG. 5, the center-spread is the modulation in that a constant amount of frequency $\Delta f$ is spread over the frequency range from the upper limit (fo+$\Delta f$) to the lower limit (fo−$\Delta f$) with the center frequency fo.

As shown in FIG. 6, by contrast, the down-spread is implemented such that the center frequency of the clock signal So is decreased by another constant amount with the upper limit frequency fo.

In the case of the down-spread SSCG, therefore, it is necessary to implement a test regarding whether the shift in the center frequency is properly operating for the clock signal So.

Since the testing circuit 1 is capable of accurately testing the center frequency of SSCG clock signal So, the test can be carried out accurately on down-spread controlling capability in SSCG by the testing circuit 1.

It is apparent from the above description including the example disclosed that the testing circuit of the invention can offer several advantages over similar testing circuits previously known.

For example, the testing circuit is configured to measure a center frequency of a clock signal outputted by a clock generator according to the exemplary embodiment of the invention, by converting an analog modulation signal into a digital signal and outputting the digital signal, counting the period of the clock signal to obtain a count according to the digital signal outputted by the clock generator, and comparing the count with the predetermined specification values related to the center frequency of the clock signal to obtain a comparison result and outputting the comparison result.

As a result of this configuration, even when a scattering in the frequency of the analog modulation signal arises, the duration for measuring the center frequency can be determined according to the scattering, and the measurement can be carried out up to the point where the area of the portion on the positive side of the periodic variation of the clock signal coincides with that on the negative side. As a result, the center frequency of clock signal can be obtained accurately.

In addition, the testing circuit is configured to perform the frequency measurement by binarizing the predetermined modulated analog signal using one half of voltage amplitude as a base, and counting the period of the clock signal outputted by the clock generator according to a binary signal outputted by the comparator.

With the present configuration, the frequency measurement can be performed not only on modulation signals having a waveform of a constant period but also on those having the period superposed by a plurality of modulation periods for the duration of each of the binarized pulse up to the point where the area of the portion on the positive side of the periodic variation of the clock signal coincides with that on the negative side. As a result, the center frequency of clock signal can be obtained accurately.

Still in addition, the testing circuit is configured to perform the frequency measurement for duration of either one cycle, or a multiple, of the binarized pulse signal.

With this method, the frequency measurement can be performed up to the point where the area on the positive side of the periodic variation of the clock signal coincides with that on the negative side even when a scattering arises in the analog modulation frequency, accurate measurements of the center frequency of clock signal can be carried out.

In addition, the number of bits in the counter and accordingly test run times can be reduced since prolonged measurement times are not necessary, which is otherwise required from the consideration on the scattering of the frequency of analog modulation signals.

In another aspect, when a triangular wave is used for the analog modulation signals, the testing circuit is configured to measure the center frequency by counting the period of the clock signal to obtain an count according to the aforementioned square wave signal used for generating the triangular wave, and comparing the count with the predetermined specification values related to the center frequency of the clock signal to obtain a comparison result and then output the comparison result.

As a result, even when a scattering in the frequency of triangular wave signals arises, the duration for measuring the center frequency can be determined according to the scattering, and the measurement can be carried out up to the point where the area of the portion on the positive side of the periodic variation of the clock signal coincides with that on the negative side, whereby the center frequency of clock signal can be obtained accurately.

In addition, the A/D converter for converting analog signals into digital signals can be eliminated by using the triangular wave generator.

Still in addition, the testing circuit is configured to perform the frequency measurement for duration of either one cycle, or a multiple, of the binarized pulse signal.

With this method, the frequency measurement can be performed up to the point where the area on the positive side of the periodic variation of the clock signal coincides with that on the negative side even when a scattering arises in the triangular wave frequency, accurate measurements of the center frequency of clock signal can be carried out.

In addition, the number of bits in the counter and accordingly test run times can be reduced since prolonged measurement times are not necessary, which is otherwise required from the consideration on the scattering of the frequency of triangular modulation signals.

In addition, since the clock generator is configured to multiply the clock signal, accurate measurements of the center frequency can be carried out with respect to the setting frequency regardless of output frequency of the clock generator.

Therefore, the testing circuit according to the embodiment of the invention is capable of performing accurate measurements of the center frequency with respect to a setting frequency regardless of SSCG output frequency.

In addition, the center frequency of SSCG clock signal So can be obtained accurately by the testing circuit regarding not only the modulation waveform outputted by the clock generator having a constant period but also a waveform resulted from the superposition of a plurality of waveforms each having different modulation periods by measuring over one cycle of the enabling signal.

Moreover, even after a considerable scattering in the modulation frequency caused from one testing sample to another due to fluctuation during forming process, the center frequency of clock signal So can be determined by identifying the point where the area on the positive side of the periodic variation of the clock signal So coincides with that on the negative side.

As a result, the measurement of the center frequency can sufficiently be made over each cycle of the enabling signal, which offers several advantages such as the reduction in the number of bits in the counter and accordingly test run times, since prolonged measurement times are not necessary, which is otherwise required when the variation of the modulation frequency is considered.

The process steps set forth in the present description on the measurement of the center frequency of clock signal may be implemented using conventional general purpose microprocessors, programmed according to the teachings in the present specification, as will be appreciated to those skilled in the relevant arts. Appropriate software coding can readily be prepared by skilled programmers based on the teachings of the present disclosure, as will also be apparent to those skilled in the relevant arts.

The present specification thus include also a computer-based product which may be hosted on a storage medium, and include instructions which can be used to program a microprocessor to perform a process in accordance with the present disclosure. This storage medium can include, but not limited to, any type of disc including floppy discs, optical discs, CD-ROMs, magneto-optical discs, ROMs, RAMs, EPROMs, EEPROMs, flash memory, magnetic or optical cards, or any type of media suitable for storing electronic instructions.

While the invention has been described in conjunction with the preferred embodiments, including specific components and configurations, it is evident that many alternatives and variations will be apparent to those skilled in the art. Accordingly, the preferred embodiments of the invention as set forth herein are intended to be illustrative and not limiting. Various changes may be made without departing from the spirit and scope of the invention as defined in the following claims.

What is claimed is:

1. A testing circuit configured to measure a center frequency of a clock signal outputted by a clock generator, said clock generator having frequency modulation capability for generating said clock signal by adding a predetermined modulated analog signal to a control voltage to be outputted to a voltage control oscillator which outputs the clock signal, said testing circuit comprising:

an A/D converter configured to receive and convert the predetermined modulated analog signal into a digital signal and output said digital signal as a reference signal based on the predetermined modulated analog signal, said A/D converter comprising a comparator configured to binarize said predetermined modulated analog signal using one half of voltage amplitude thereof as a base;

a counter configured to receive the digital signal and the clock signal and count a period of said clock signal to obtain a count according to said digital signal, said counter being configured to count a period of said clock signal outputted by said clock generator according to a binary signal outputted by said comparator;

a counter memory configured to store said count;

a specification memory configured to store at least one specification value related to said center frequency of said clock signal; and a comparator configured to compare said count with said at least one specification value to obtain a comparison result and output said comparison result.

2. The testing circuit according to claim 1, wherein said counter is configured to count said period for duration of anyone of one cycle of a clock pulse inputted by said A/D converter and a multiple thereof.

3. The testing circuit according to claim 2, wherein said clock generator is configured to multiply said clock signal.

4. The testing circuit according to claim 1, wherein said clock generator is configured to multiply said clock signal.

5. A testing circuit configured to measure a center frequency of a clock signal outputted by a clock generator, said clock generator having frequency modulation capability for generating said clock signal by adding a predetermined modulated analog signal to a control voltage to be outputted to a voltage control oscillator which outputs the clock signal, said testing circuit comprising:

A/D converter means for receiving and converting the predetermined modulated analog signal into a digital signal and output said digital signal as a reference signal based on the predetermined modulated analog signal, said A/D converter means including comparator means for binarizing said predetermined modulated analog signal using one-half of voltage amplitude thereof as a base;

counter means for receiving the clock signal and the digital signal and counting a period of said clock signal to obtain a count according to said digital signal, said counter means being operable to count a period of said clock signal outputted by said clock generator means according to a binary signal outputted by said comparator means;

counter memory means for storing said count;

specification memory means for storing at least one specification value related to said center frequency of said clock signal; and comparator means for comparing said count with said at least one specification value to obtain a comparison result and output said comparison result.

6. The testing circuit according to claim 5, wherein said counter means is configured to count said period for duration of anyone of one cycle of a clock pulse inputted by said A/D converter means and a multiple thereof.

7. The testing circuit according to claim 6, wherein said clock generator means is configured to multiply said clock signal.

* * * * *